United States Patent [19]
Shiomi et al.

[11] Patent Number: 5,095,355
[45] Date of Patent: Mar. 10, 1992

[54] BIPOLAR CROSS-COUPLED MEMORY CELLS HAVING IMPROVED IMMUNITY TO SOFT ERRORS

[75] Inventors: Toru Shiomi; Kakutaro Suda; Tetsuo Higuchi, all of Hyogo, Japan

[73] Assignee: Mitsubishi Denki Kabushiki Kaisha, Tokyo, Japan

[21] Appl. No.: 554,988

[22] Filed: Jul. 17, 1990

Related U.S. Application Data

[63] Continuation of Ser. No. 127,924, Dec. 1, 1987, abandoned.

[30] Foreign Application Priority Data

Dec. 1, 1986 [JP] Japan ............................. 61-287321

[51] Int. Cl.$^5$ ............... H01L 29/72; H01L 27/02; H01L 29/48
[52] U.S. Cl. ........................... 357/35; 357/15; 357/34; 357/36; 357/45; 357/51
[58] Field of Search ............... 357/34, 45, 36, 35, 357/15, 51

[56] References Cited

U.S. PATENT DOCUMENTS

| | | | |
|---|---|---|---|
| 3,969,748 | 7/1976 | Horie et al. | 357/34 |
| 4,047,217 | 9/1977 | McCaffrey et al. | 357/34 |
| 4,278,987 | 7/1981 | Imaizumi et al. | 357/60 |
| 4,566,174 | 1/1986 | Yasuda et al. | 357/34 |

FOREIGN PATENT DOCUMENTS

| | | | |
|---|---|---|---|
| 0057549 | 8/1982 | European Pat. Off. | 357/34 |
| 2845062 | 4/1979 | Fed. Rep. of Germany | 357/34 |
| 62-97374 | 5/1987 | Japan | 357/34 |
| 62-214667 | 9/1987 | Japan | 357/23.4 |
| 63-313860 | 12/1988 | Japan | 357/34 |

OTHER PUBLICATIONS

*IEEE Transactions of Nuclear Science*, J. A. Zoutendyk, "Modeling of Single-Event Upset in Bipolar Integrated Circuits", Bol NS-30, No. 6, Dec. 1983, pp. 4540-4545.

Primary Examiner—Andrew J. James
Assistant Examiner—Ngan Van Ngo
Attorney, Agent, or Firm—Lowe, Price, LeBlanc & Becker

[57] ABSTRACT

A bipolar RAM comprising a plurality of memory cells formed of cross-coupled bipolar transistors and a peripheral bipolar circuit formed of bipolar transistor, provided with an epitaxial layer which is to be the collector region of the bipolar transistor in the memory cell portion which is thinner and has higher impurity density than the epitaxial layer which is to be the collector region of a bipolar transistor in the peripheral circuit.

12 Claims, 9 Drawing Sheets

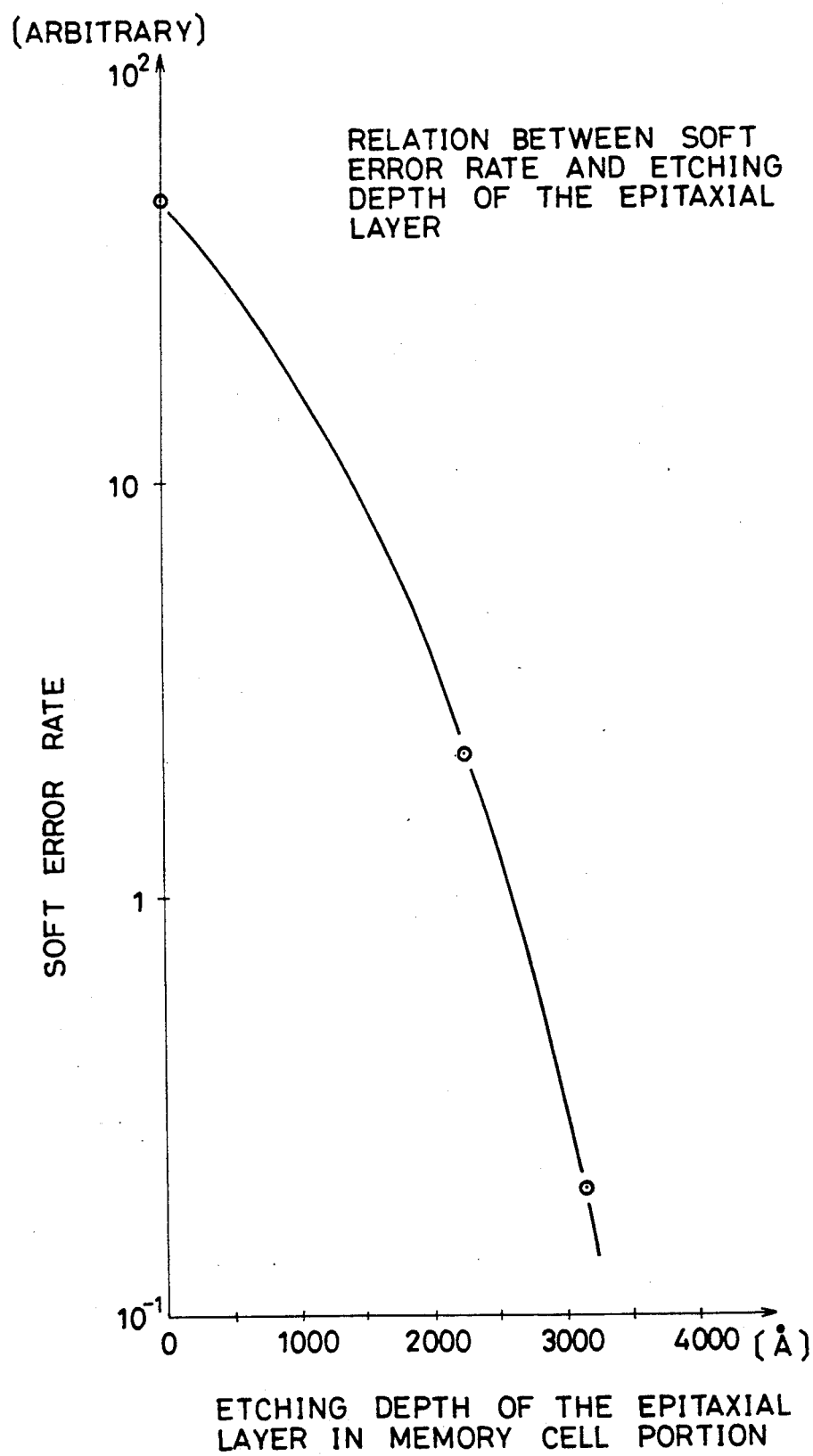

BIPOLAR CROSS-COUPLED MEMORY CELLS HAVING IMPROVED IMMUNITY TO SOFT ERRORS

This application is a Continuation application of application Ser. No. 07/127,924, filed Dec. 1, 1987 now abandoned.

BACKGROUND OF THE INVENTION

1. Field of the Invention

The present invention relates to a semiconductor memory device and particularly to a structure of a bipolar RAM (Random Access Memory) having superior immunity to soft errors.

2. Description of the Prior Art

FIG. 1 shows a schematic diagram of a conventional bipolar RAM which is generally used.

Referring to FIG. 1, the bipolar RAM comprises a memory cell array MA having memory cells Cij ($i=0, \ldots n-1, j=0, \ldots m-1$) arranged in a matrix of n rows and m columns. The memory cell Cij is a Schottky clamped type (non-saturating type) and comprises two cross-coupled multiemitter transistors Q1 and Q2. The first emitter of each of the transistors Q1 and Q2 is connected to the bit line Bi and to the bit line $\overline{Bi}$, respectively, while the second emitters are both connected to a hold line (negative word line) Hi. The collector of each of the transistors Q1 and Q2 is connected to the word line Wi through resistances R1 and R2, respectively. Schottky barrier diodes SBD1 and SBD2 are provided between the word line Wi and the collectors of the transistors Q1 and Q2. Having the above described structure, one memory cell forms a flip-flop.

In the row address system, there are provided as the peripheral circuit of the bipolar RAM, a row address buffer RA which receives external row address signals $x_0 \sim x_{l-1}$ to generate complementary internal address signals $x_0, \overline{x_0}, \ldots x_{l-1}, \overline{x_{l-1}}$, an X decoder XD which decodes the internal row address signals from the row address buffer RA to generate address decoded signals $V_{x0} \sim V_{x,n-1}$ to select one word line, and word drivers $WD_0 \sim WD_{n-1}$ which respond to the signal from the X decoder XD to select one word line and rise the potential of the selected word line. The word drivers $WD_0 \sim WD_{n-1}$ are provided in correspondence with the word lines.

The column address system comprises a column address buffer CA which generates complementary internal address signals $Y_0, \overline{Y_0} \sim Y_{k-1}, \overline{Y_{k-1}}$ from external column address signals $Y_0 \sim Y_{k-1}$, a Y decoder YD which decodes the internal address signals from the column address buffer CA to select a pair of bit lines and bit line drivers $BD_0 \sim BD_{m-1}$ which connects the pair of bit lines to the data bit lines DB and $\overline{DB}$ in response to the output of the Y decoder YD. The bit line drivers $BD_0 \sim BD_{m-1}$ are provided in correspondence with the bit line pairs.

The data input/output system comprises current switch transistors $Q_0, Q_0' \sim Q_{m-1}, Q_{m-1}'$ provided at each bit line, a sense amplifier SA for detecting the collector current of the transistors connected to the selected bit line pairs and outputs a signal in response to the value of the collector current and, a write buffer WA which is activated in response to a signal WE identifying the operation modes of writing/reading to apply a voltage value corresponding to the writing data $D_{in}$ to the base of each current switch transistor. Each emitter of the switch transistors $Q_0, Q_0' \sim Q_m, Q_m'$ is connected to the respective bit line. Each peripheral circuit is formed using bipolar transistors.

FIG. 2 shows the structure of a main portion of the memory portion of the bipolar RAM shown in FIG. 1. FIG. 2 shows memory cells $C_{00}$ and $C_{01}$. Each of multiemitter transistor Q1, Q2 of the memory cells comprises two transistors QC1, QH1 and QC2, QH2, respectively.

The potentials at the collectors of the transistor elements QC1, QH1, QC2 and QH2 are clamped by the Schottky barrier diodes SBD1 and SBD2, so that the transistor elements do not enter into the saturation state. For example, the memory cell $C_{00}$ is located between a word line $W_0$ and a hold line $H_0$ through which a constant current $I_H$ flows and between a pair of bit lines $B_0$ and $\overline{B_0}$. The word line $W_0$ is selected by a word driver $WD_0$ and the bit line pair $B_0$ and $\overline{B_0}$ are selected by a bit driver $BD_0$ (not shown) so that the memory cell $C_{00}$ can be selected. However, it is also possible to select the memory cell $C_{00}$, even if only the word line $W_0$ and all the bit line pairs are selected. The sense amplifier SA detects the data stored in the memory cells during the read mode. The write amplifier WA produces output potential $V_D$ and $\overline{V_D}$ whose values are different when the potential of a write-enable signal WE is low, which means the write mode, and whose values are the same when the potential of the write-enable signal WE is high, which means the read mode.

The operation of the memory cell array of FIG. 1 will be explained by using FIG. 2, which is the main portion of FIG. 1. The access operation with regard to the memory cell $C_{00}$ (FIG. 1) is shown by the progression of the following steps.

Step 1: Non-selected state;
Step 2: The read mode in the selected state;
Step 3: The write mode in the selected state;
Step 4: The read mode in the selected state; and
Step 5: Non-selected state.

In step 1, it is assumed that the transistor elements QH1 and QH2 of the memory cell $C_{00}$ which form a flip-flop are conductive and non-conductive respectively. In addition, the transistor elements QC1 and QC2 of the memory cell $C_{00}$ are non-conductive, since the cell $C_{00}$ is non-selected. Further, the potential $V_D$ and $\overline{V_D}$ of the write amplifier WA (FIG. 1) are the same, which means the read mode. The collector potential $V_{BS}$ is represented as follows.

$$V_{BS} = V_{W0} - R \times I_{BI}$$

where R is the resistance of the resistor R2 and $I_{BI}$ is the base current of the transistor element QH1. In this case, the value $R \times I_{BI}$ is very small so that the Schottky barrier diode SBD2 cuts off. Contrary to this, the collector voltage VCS is represented as follows.

$$V_{CS} = V_{W0} - V_{BE}$$

where $V_{BE}$ is the forward voltage of the Schottky barrier diode SBD1. In this case, the collector current $I_{CI}$ is relatively large so that the Schottky barrier diode SBD1 is conductive.

In step 2, the potential $V_{W0}$ of the word line $W_0$ is raised so that the collector potential $V_{BS}$ and $V_{CS}$ are also raised, while the potential $V_{W1}$ of the word line $W_1$ is lowered. The potentials $V_D$ and $\overline{V_D}$, which are the same, are preset to be between the potentials $V_{BS}$ and $V_{CS}$. Preferably, the potentials $V_D$ and $\overline{V_D}$ equal $(V_{BS}+V_{CS})/2$. In this case, since the transistor element QC1, to whose base is applied the potential $V_{BS}$, and a transistor $Q_0$, to whose base is applied the potential $V_D$ which is lower than the potential $V_{BS}$ form a current switch, the transistor element QC1 conducts and the transistor $Q_0$ remains non-conductive. Similarly, since the transistor elements QC2 and the transistor $Q_0'$ form a current switch, the transistor element QC2 remains non-conductive and the transistor $Q_0'$ conducts. As a result, currents indicated by arrows X1 and X2 flow through data bit lines DB and $\overline{DB}$, respectively. Therefore, the currents $I_D$ and $\overline{I_D}$ supplied to the sense amplifier SA are represented as follows.

$$I_D = 0$$
$$\overline{I_D} = I_B$$

In this case, the output data Dout of the sense amplifier SA is, for example, the logic "0".

In step 3, the potential $\overline{V_D}$ is lowered which means the write mode for writing the logic "1". When the potential $V_D$ equals the potential $V_{CS}$ at time t1, the emitter currents of the transistor element QC2 and the transistor $Q_0'$ become equal $(=\frac{1}{2}I_B)$. Furthermore, when the potential $\overline{V_D}$ becomes lower than the potential $V_{CS}$, the emitter current of the transistor element QC2 becomes equal to $I_B$ and the emitter current of the transistor $Q_0'$ becomes zero. In this case, the difference in potential between the potential $V_{CS}$ and $\overline{V_D}$ is, for example, higher than 200 mV. As a result, the potentials $V_{BS}$ and $V_{CS}$ become low and high, respectively, so that the state of the flip-flop is reversed. In this write mode, the potential $V_D$ is increased in order to spend up the write operation. However, it should be noted that the potential $V_D$ can remain at the same level as the read mode. In this case, the write speed becomes lower.

In step 4, the levels of the potentials $V_D$ and $\overline{V_D}$ are the same. In this case, currents indicated by arrows Y1 and Y2 flow through the data bit lines DB and $\overline{DB}$, respectively. Therefore, the currents $I_D$ and $\overline{I_D}$ supplied to the sense amplifier SA are represented as follows.

$$I_D = I_B$$
$$\overline{I_D} = 0$$

In this case, the output data Dout of the sense amplifier SA is the logic "1".

In step 5, the potential $V_{W0}$ of the word line $W_0$ is lowered so that the collector potentials $V_{BS}$ and $V_{CS}$ are also lowered. However, the lowering of the potentials $V_{BS}$ and $V_{CS}$ takes a longer time than the lowering of the potential $V_{W0}$. Contrary to this, the potential $V_{W1}$ of the word line $W_1$ is raised.

In steps 2, 3 and 4 wherein the memory cell $C_{00}$ is selected and the memory cell $C_{01}$ is non-selected, both of the potentials $V_{BN}$ and $V_{CN}$ of the memory cell $C_{01}$ should always be lower than the potentials $V_D$ and $\overline{V_D}$ so that the transistor elements QC1 and QC2 thereof are always non-conductive. Therefore, access into the memory cell $C_{01}$ is never effected.

In the bipolar RAM of the above described structure, some problems become serious which could conventionally be bypassed, as the bipolar RAM becomes more highly integrated. One of the problems is the soft errors induced by $\alpha$ particles.

The $\alpha$-particle induced soft errors are induced by $\alpha$ particles emitted from radio active elements such as uranium and thorium which are slightly contained in the package material which holds the semiconductor chip in which the RAM is formed. The energy of the $\alpha$ particles emitted due to the $\alpha$ decay of the uranium and thorium centers mainly on 5 MeV and ranges to at most 9 MeV. Therefore, the $\alpha$ particles emitted from the package possibly have the energy of this level. The $\alpha$ particle of 5 MeV runs about 30 $\mu$m in silicon, generating about $1.4 \times 10^4$ electron-hole pairs. Specifically, the holes generated in the n type collector region flow to the substrate attracted by the field in the junction when they arrive at the collector.substrate junction. The electrons generated in the n type collector region and those electrons which are generated in the substrate and reached to the collector.substrate junction region and drawn into the collector region by the field in the junction, diffuse in the n type collector region. Consequently, there arises a current flow from the collector to the substrate. This lowers the collector potential of the off state transistor of the pair of transistors in the memory cell, causing the inversion of information in the memory cell. This phenomenon will be described with reference to the figures.

FIG. 3 shows a cross section of the structure of a multiemitter transistor in the memory cell of the bipolar RAM and the bipolar transistor contained in the peripheral circuit.

Referring to FIG. 3, the memory cell portion M and the peripheral circuit portion S are electrically separated from each other by a separating oxide film 8.

The bipolar transistor in the memory cell portion M is formed on a p$^-$ type semiconductor substrate 1 of, for example, silicon and comprises an n$^+$ buried layer 2 for reducing the collector resistance and to provide electrical contact to the collector, an n$^-$ epitaxial layer 3 formed on the n$^+$ type buried layer 2 and functions as a collector, an island of p$^+$ type base diffusion region 4 formed on the n$^-$ epitaxial layer 3 and acts as a base and, n$^+$ emitter diffused regions 5a and 5b formed on a prescribed region in the island of p$^+$ type base diffusion region 4 and act as emitters. Aluminum wires 6a, 6b and 6d are provided in the n$^+$ buried layer 2 and n$^+$ emitter regions 5a and 5b, respectively. One of the aluminum wires 6b and 6d is connected to the bit line and the other is connected to a hold line for holding a constant current flow. An aluminum wire 6c is provided in the p$^+$ type base diffusion region 4. The aluminum wire 6c is connected to a collector of the other memory transistor. The p$^+$ type base diffusion region 4 and the n$^-$ epitaxial layer 3 are connected to the word line by the aluminum wire 6e. A resistance 10 is formed between the p$^+$ type base diffusion region 4 and the aluminum wire 6e while a Schottky barrier diode 9 is formed between the n$^-$ epitaxial layer 3 and the aluminum wire 6e. Between each of the aluminum wirings 6a ~ 6e there is provided an insulating film 7 for electrically separating the wire from each other.

The bipolar transistor of the peripheral circuit portion S comprises a p$^-$ type semiconductor substrate 1, an n$^+$ type buried layer 2 for taking a collector electrode and for reducing the collector resistance, an n$^-$ type epitaxial layer 3 formed on the n$^+$ type buried layer 2 to be the collector region, a p$^+$ type diffusion layer 4 formed on the n$^-$ type epitaxial layer 3 to be a base region and an n$^+$ type diffusion layer 5c formed as an island in the p$^+$ base diffusion layer 4. Aluminum wires 6f, 6g and 6h are provided in the n⁻ type buried layer 2, p⁺ base diffusion layer 4 and the n⁺ type emitter diffusion layer 5c, respectively.

Referring to FIG. 3, in the transistor of the memory cell portion, a base-collector junction capacitance $C_{PC}$ is formed between the p⁺ type base diffusion layer 4 and the n⁻ type epitaxial layer 3. Base-emitter junction capacitance $C_{TE}$ are formed between the p⁺ base diffusion layer 4 and the n⁺ type emitter diffusion layers 5a and 5b. A collector-substrate junction capacitance $C_{TS}$ is formed between the n⁻ type epitaxial layer 3 (n⁺ buried layer) and the semiconductor substrate 1. The Schottky barrier diode 9 has a junction capacitance $C_{SBD}$.

FIG. 4 shows an equivalent circuit of a conventional memory cell of a bipolar of RAM. FIG. 4 shows cross-coupled multiemitter transistors 11a and 11b, a resistance 10a provided between the collector of a transistor 11a and a word line 6, a Schottky barrier diode 9a, a resistance 10b provided between the collector of the transistor 11b and the word line 6, a Schottky barrier diode 9b and a hold line 12 for drawing a constant current from the memory cell. The junction capacitances 14a and 14b of the Schottky barrier diodes 9a and 9b, the base-collector junction capacitances 15a and 15b of the transistors 11a and 11b, the base-emitter junction capacitances 16a and 16b of the transistors 11a and 11b and the collector-substrate junction capacitances 17a and 17b of the transistors 11a and 11b are shown as the parasitic capacitances. The soft errors induced by α particles will be hereinafter described with reference to FIGS. 3 and 4.

Now, suppose that the multiemitter transistor 11a is off and the multiemitter transistor 11b is on. On this occasion, the potential of the collector of the transistor 11a, namely the potential of the node N, is "H". As described above, the potential $V_H$ of the node N is as follows:

$$V_H = V_W - R \cdot I_B$$

where $V_W$ is the potential of the word line 6, R is the resistance value of the resistance 10b and $I_B$ is the base current of the transistor 11a. Meanwhile the collector potential $V_L$ of the transistor 11b is as follows:

$$V_L = V_W - V_{BE},$$

where $V_{BE}$ is the forward direction potential drop of the Schottky barrier diode 9b.

As is apparent from FIG. 4, the capacitance C incidental to the node N will be $$C = C_{TS} + C_{SBD} + 4C_{TC} + 2C_{TE}$$

By the radiation of α ray, the electron-hole pairs are generated in the collector-substrate junction in the memory cell. The charge thereof is denoted by ΔQ and the change of the potential of the node N ΔV will be ΔQ/C.

The increase of the capacitance value C will minimize the above potential change ΔV. The junction capacitances 14a and 14b of the capacitance value $C_{SBD}$ and the junction capacitances 15a and 15b of the capacitance value $C_{TC}$ are in parallel with the load resistances 10a and 10b of the memory cell, thereby serving as a speed-up capacitor at the time of information inversion. The capacitance value $C_{TC}$ of the junction capacitances 15a and 15b undergoes the effect of a factor by the multiple of 4 due to the Miller effect, so that the increase of the value $C_{TC}$ increases the stability against the α particle-inducing inversion of the information.

Referring to FIG. 3, the junction capacitances 15a and 15b are the PN junction capacitance of the n⁻ type epitaxial layer 3 and the p⁺ type base diffusion region 4. Accordingly, the capacitance value $C_{TC}$ will change according to the film thickness and the impurity concentration of the n⁻ type epitaxial layer 3. Conventionally, the n⁻ type epitaxial layer 3 was formed simultaneously with the memory cell portion and the peripheral circuit portion and it was controlled to have the same thickness and same impurity concentration.

In the conventional semiconductor memory device structured as above, if the thickness of the n⁻ type epitaxial layer 3 is increased, the collector-base junction capacitance value $C_{TC}$ of the transistors in the memory cell portion and the peripheral circuit portion becomes small, enabling the high speed operation. However, due to the small capacitance value, the inversion of information in the memory cell induced by the α particles etc. is likely to occur. Likewise, if the impurity concentration of the n⁻ type epitaxial layer 3 is decreased, the high speed operation becomes possible while the inversion of information easily occurs.

On the other hand, if the thickness of the n⁻ epitaxial layer 3 is decreased, the capacitance value $C_{TC}$ increases and the inversion of information in the memory cell is not likely to occur. However, a high speed operation can not be expected. Likewise, if the concentration of the n⁻ type epitaxial layer 3 is increased, the inversion of information in the memory cell is depressed, but a high speed operation can not be expected.

The mechanism of the α particles-induced soft errors in the bipolar RAM is described in the Transaction of IECE of Japan, 1980/2, VOL. J63-C No.2, K. Mitsusada et al. "Alpha-Particle-Induced Soft Errors in High Speed Bipolar RAM".

Bipolar RAMs devised for the soft errors are disclosed in Japanese Patent Laying-Open Gazette 4263/1981, Japanese Patent Laying-Open Gazette 196563/1982 and in the Japanese Patent Laying-Open Gazette 150266/1986.

In the first mentioned prior art, an ion implantation of As (arsenic) is carried out in the n⁺ type buried layer before forming the n⁺ type epitaxial layer and an n⁺ type buried layer is formed also in the n⁻ epitaxial layer by the auto doping for forming the n⁻ epitaxial layer, increasing the junction capacitance between the collector and the base. However, the thickness of the n⁻ type epitaxial layer and the impurity concentration are not taken into consideration.

In the second mentioned prior art, the n⁺ type buried layer and the p⁺ base diffusion layer in the memory cell portion are in contact with each other to increase the collector-base junction capacitance of the memory cell transistor. In this prior art, the thickness of the n⁻ type epitaxial layer and the impurity concentration are not taken into consideration.

In the third mentioned prior art, the n⁻ type epitaxial layer in the memory cell portion are made thinner than the n⁻ type epitaxial layer in the transistor of the peripheral circuit portion to increase the collector-base junction capacitance of the transistor in the memory cell portion. However, the relation between the impurity concentration of the n⁻ type epitaxial layer in the memory cell portion and that of the n⁻ type epitaxial layer in the peripheral circuit portion is not taken into consideration.

SUMMARY OF THE INVENTION

The object of the present invention is to provide a highly reliable bipolar RAM having high immunity to soft errors and capable of high speed operation.

In the bipolar RAM according to the present invention, the epitaxial layer in the memory cell portion is made thinner than the epitaxial layer of the transistors in the peripheral circuit portion and the impurity concentration of the epitaxial layers in the memory cell portion is made larger than that of the epitaxial layers of the transistors in the peripheral circuit portion.

Since the epitaxial layers only in the memory cell portion are made thinner and impurity concentration is made larger, the base-collector junction capacitance of the transistors in the memory cell portion becomes large, providing high immunity to soft errors. In addition, the capacitance functions as a speed up capacitor so that the operation speed of the memory cell do not decrease. Meanwhile, the transistors in the peripheral circuit portion have small base-collector junction capacitance as in the conventional transistors, so that the peripheral circuit portion maintains the capability of high speed operation.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows the relation between the soft error rate and the etching depth of the epitaxial layer forming a collector of a transistor in the memory cell.

DESCRIPTION OF THE PREFERRED EMBODIMENTS

FIGS. 5A to 5G are cross sectional views of main steps showing the manufacturing process of a bipolar RAM according to one embodiment of the present invention. The manufacturing method of the bipolar RAM according to one embodiment of the present invention will be hereinafter described with the reference to FIGS. 5A to 5G. In each of the figures, M denotes the memory cell portion while S denotes transistors in a peripheral circuit such as a decoder, a driver and the like.

Figure 1:
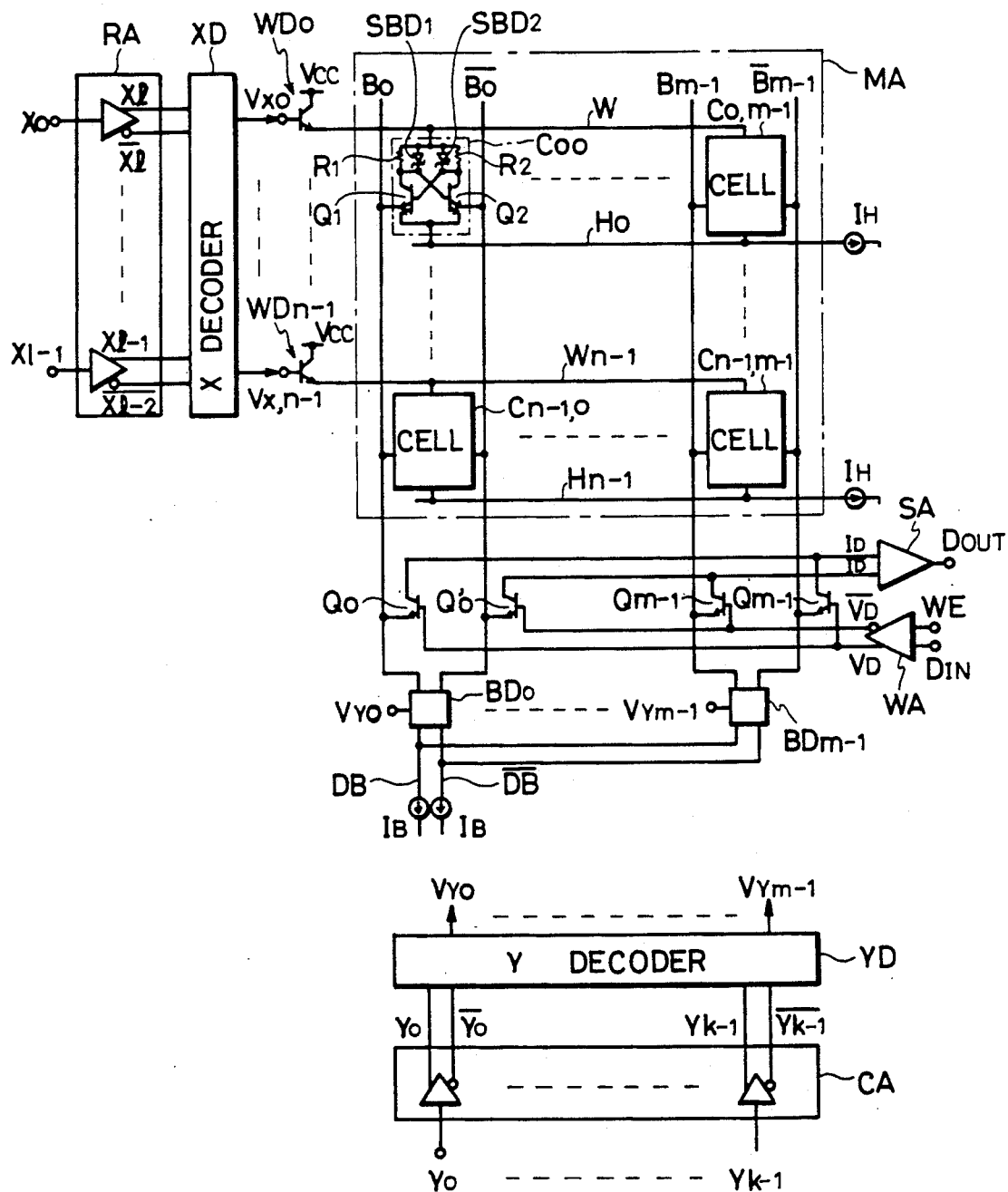
FIG. 1 is a block diagram showing the whole structure of a conventional bipolar RAM.
Figure 2:
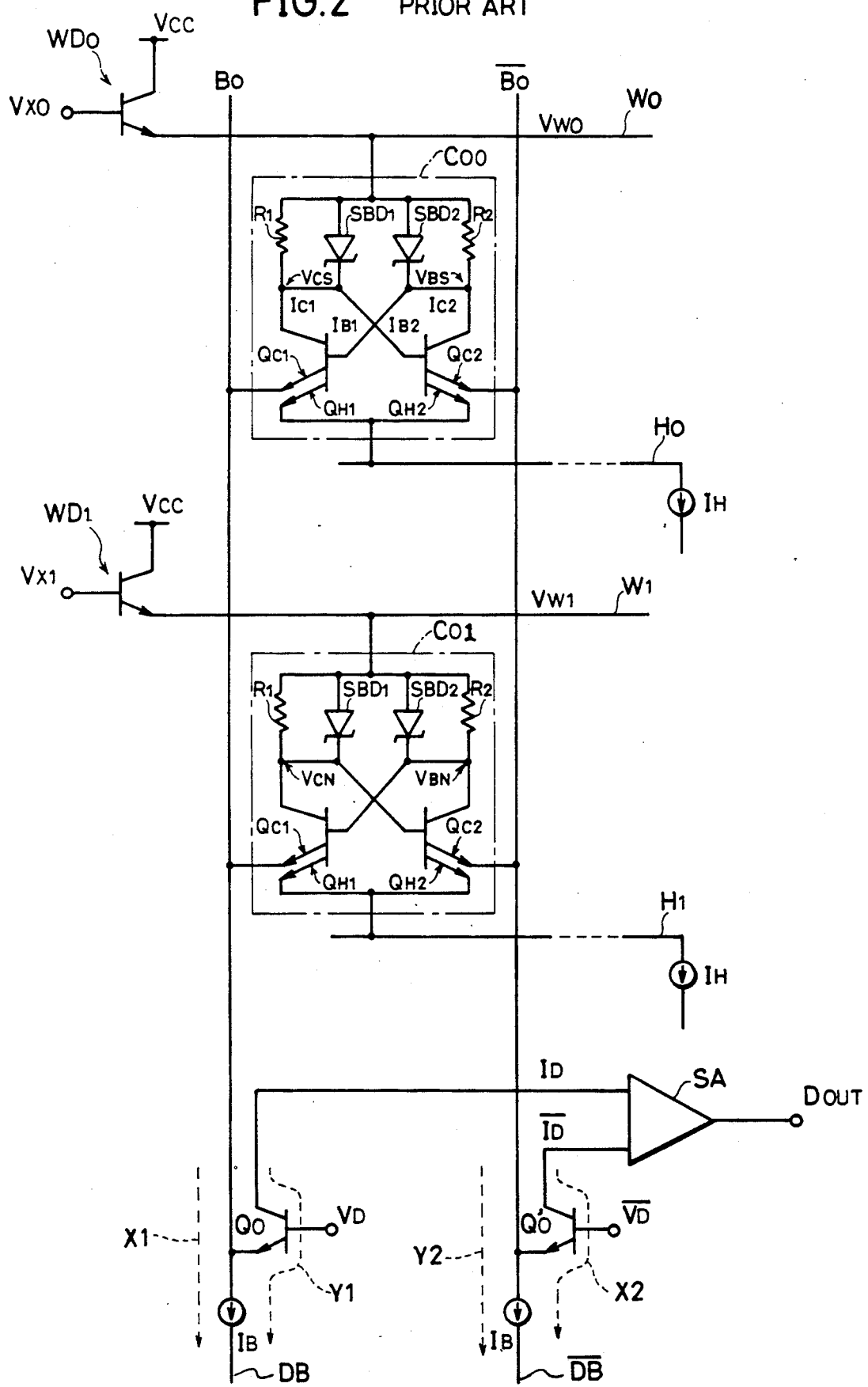
FIG. 2 shows the structure of a main portion of a bipolar RAM of FIG. 1.
Figure 3:
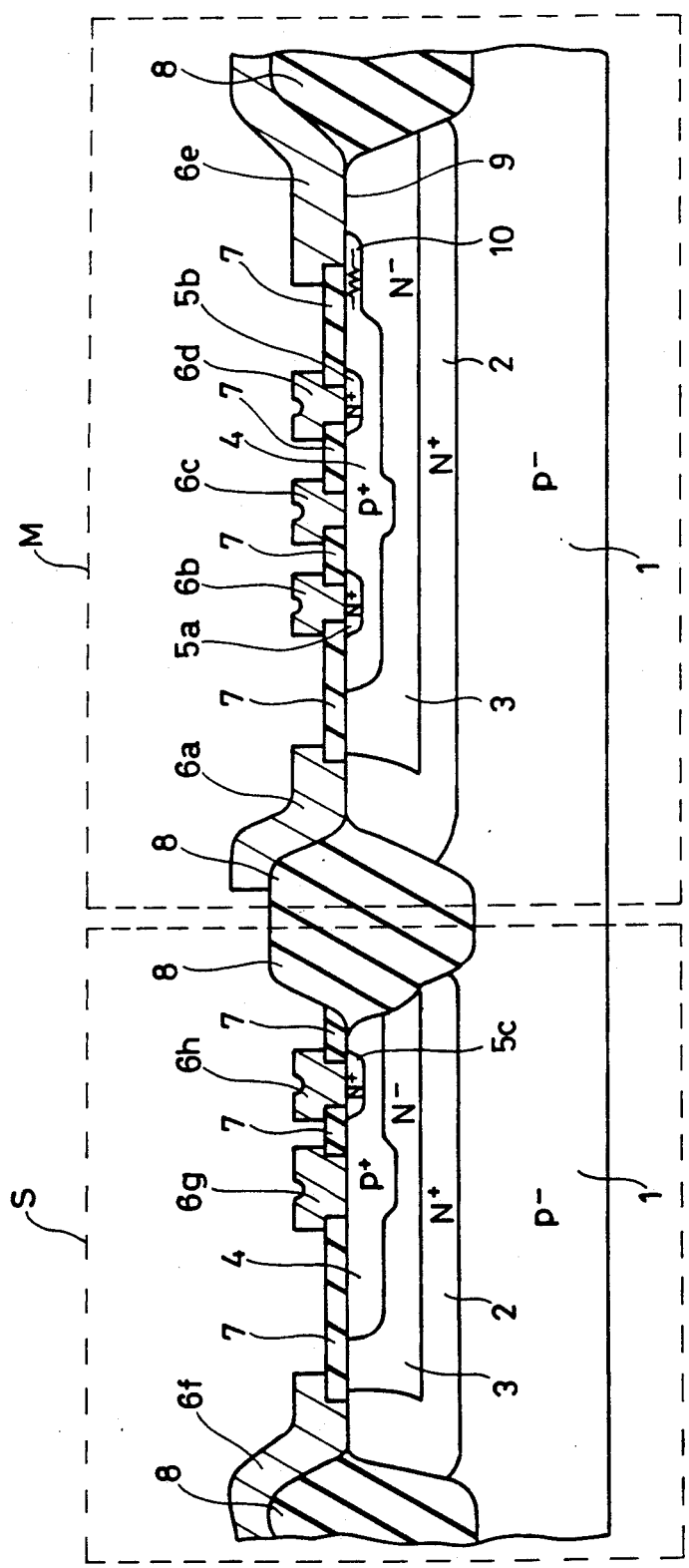
FIG. 3 shows a cross sectional structure of the transistors in the memory cell portion and in the peripheral circuit portion in a conventional bipolar RAM.
Figure 4:
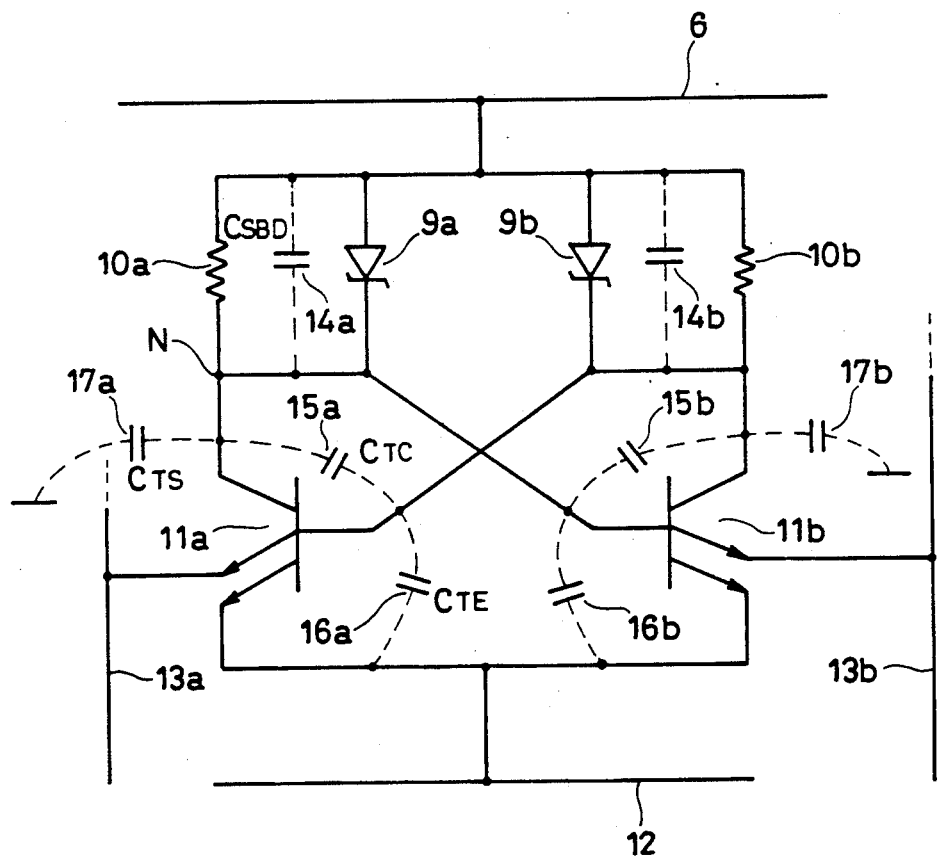
FIG. 4 shows an equivalent circuit of the memory cell of the bipolar RAM.
Figure 5A:
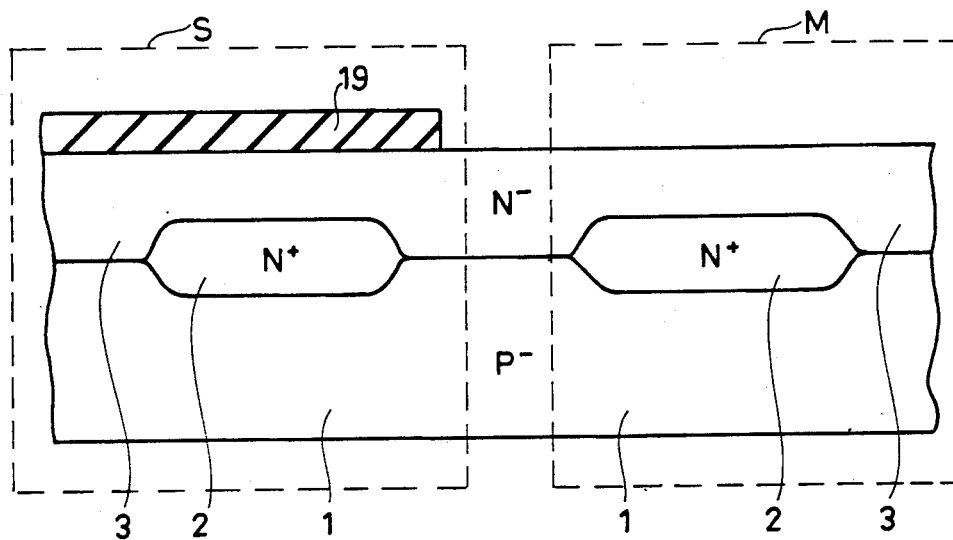
FIGS. 5A through 5G are cross sectional views showing main steps of the manufacturing process of a bipolar RAM according to one embodiment of the present invention.

Referring to FIG. 5A, as in the prior art, an $n^+$ type buried layer 2 of large impurity concentration and an $n^-$ type epitaxial layer 3 of small impurity concentration are formed on a $p^-$ type semiconductor (for example, silicon) substrate 1, which correspond to the memory cell portion M and the peripheral circuit portion S, respectively. The $n^+$ type buried layer 2 is formed by at first forming an $n^+$ type impurity diffusion region by introducing n type impurities to large density at a prescribed region on the surface of the $p^-$ type semiconductor substrate 1 and then by up-extending the $n^+$ type impurity diffusion region during forming the $n^-$ type epitaxial layer 3. Then, for etching of $n^-$ type epitaxial layer 3 in the memory cell portion M, a nitride film 19 is formed on the $n^-$ epitaxial layer 3 in the peripheral circuit portion S.

Figure 5B:
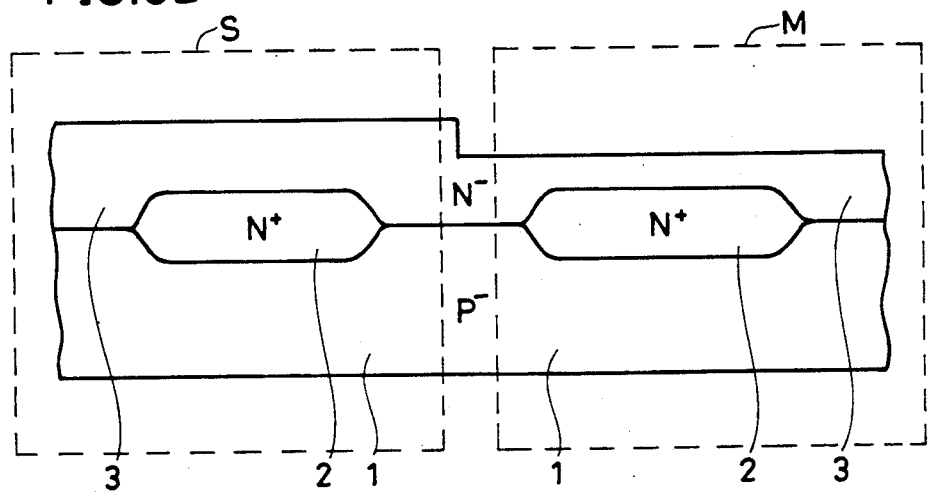

Referring to FIG. 5B, the selective oxidation of the memory cell portion M is carried out by using the nitride film 19 as a mask and then the oxide film (not shown) is etched away. Thus, the thickness of the $n^-$ type epitaxial layer 3 in the memory cell portion M is made thinner than that of the $n^-$ type epitaxial layer in the peripheral circuit portion S. On this occasion, the $n^-$ type epitaxial layer 3 in the memory cell portion M is etched away by more than 2500Å.

Figure 5C:
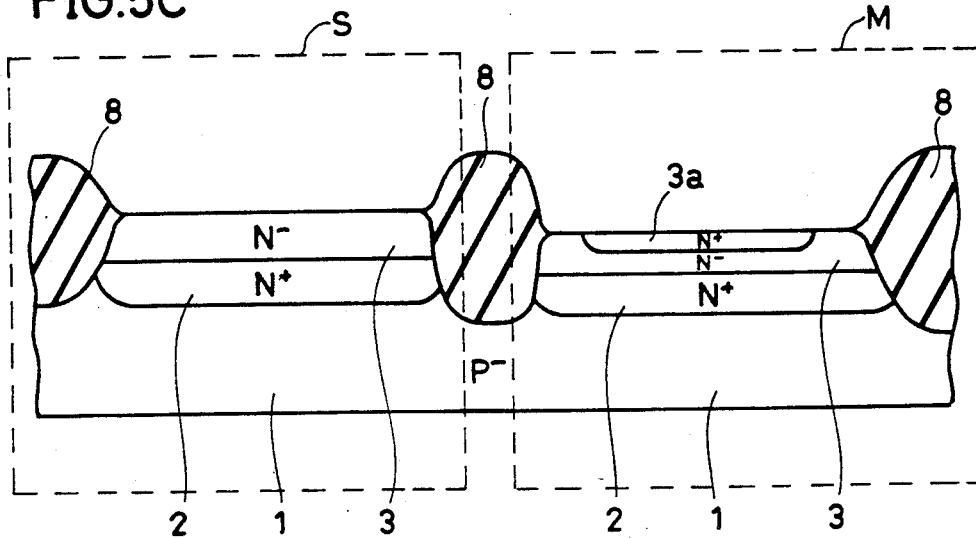

Referring to FIG. 5C, a field oxide film 8 for separating element is formed by the conventional selective oxidation. Then, the peripheral circuit portion S is masked with a resist (not shown) and the n type impurities are introduced and diffused in the $n^-$ type epitaxial layer 3 in the memory cell portion M to a large concentration, preferably $1.0 \times 10^{13}/cm^3$, to form an $n^+$ diffusion layer 3a.

Figure 5D:
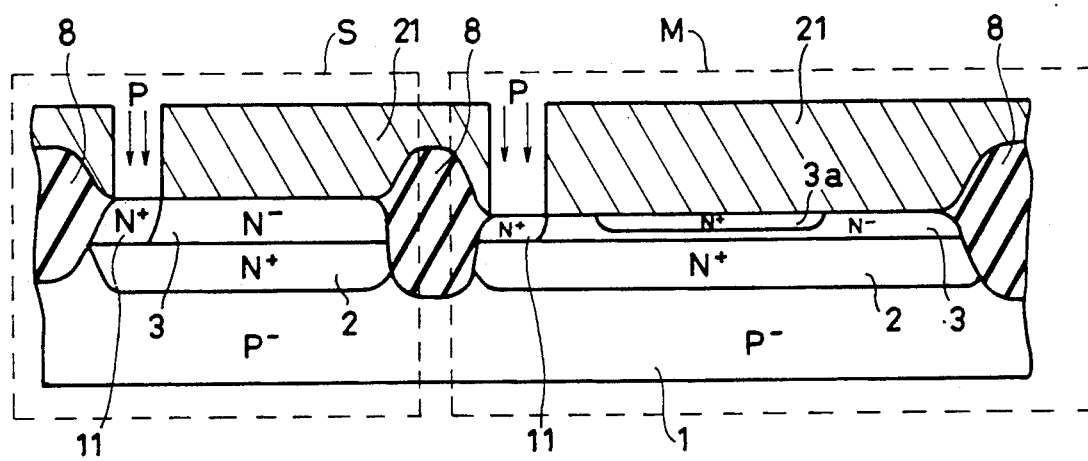

Referring to FIG. 5D, a resist 21 is formed on the $n^-$ type epitaxial layer 3 on the memory cell portion M and the peripheral circuit portion S. Then an aperture is provided on a prescribed region (which is to be a collector electrode take out region) of the resistor 21, the ion implantation of the n type impurity such as phosphorous (p) is carried out through this aperture, and the implanted ion is driven to form a collector wall 11 for taking the collector electrode.

Figure 5E:
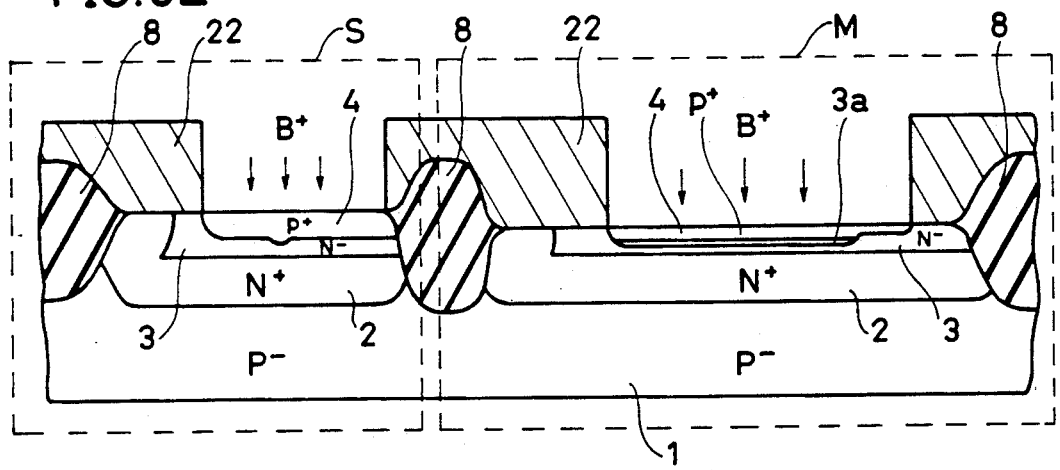

Referring to FIG. 5E, a new resist 21 is formed on the memory cell portion M and the peripheral circuit portion S. An aperture is formed in a prescribed region (which corresponds to the base region) of the resist 21 and the ion implantation of the p type impurity such as boron (B) to a large concentration is carried out and the boron is diffused to form a $p^+$ type base diffusion region 4. The $p^+$ type base diffusion region 4 in the memory cell portion M is formed such that it overlaps with the $n^+$ type diffusion layer 3a.

Figure 5F:
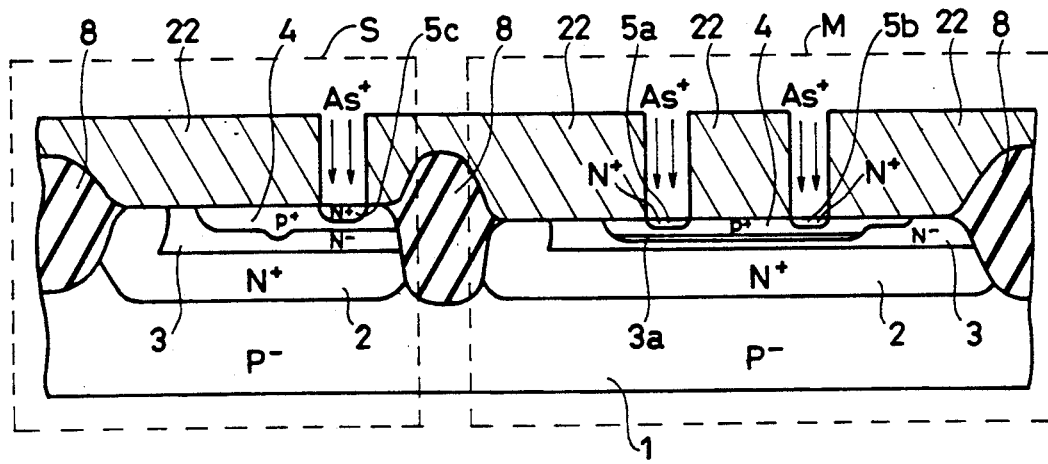

Referring to FIG. 5F, a resist film 22 is formed on the memory cell portion M and the peripheral circuit portion S. Then an aperture is formed in a prescribed region (which corresponds to the emitter) of the resist film 22 and then n type impurity such as Arsenic (As) is ion implanted and driven to form an $n^+$ type emitter regions 5a, 5b and 5c.

Figure 5G:
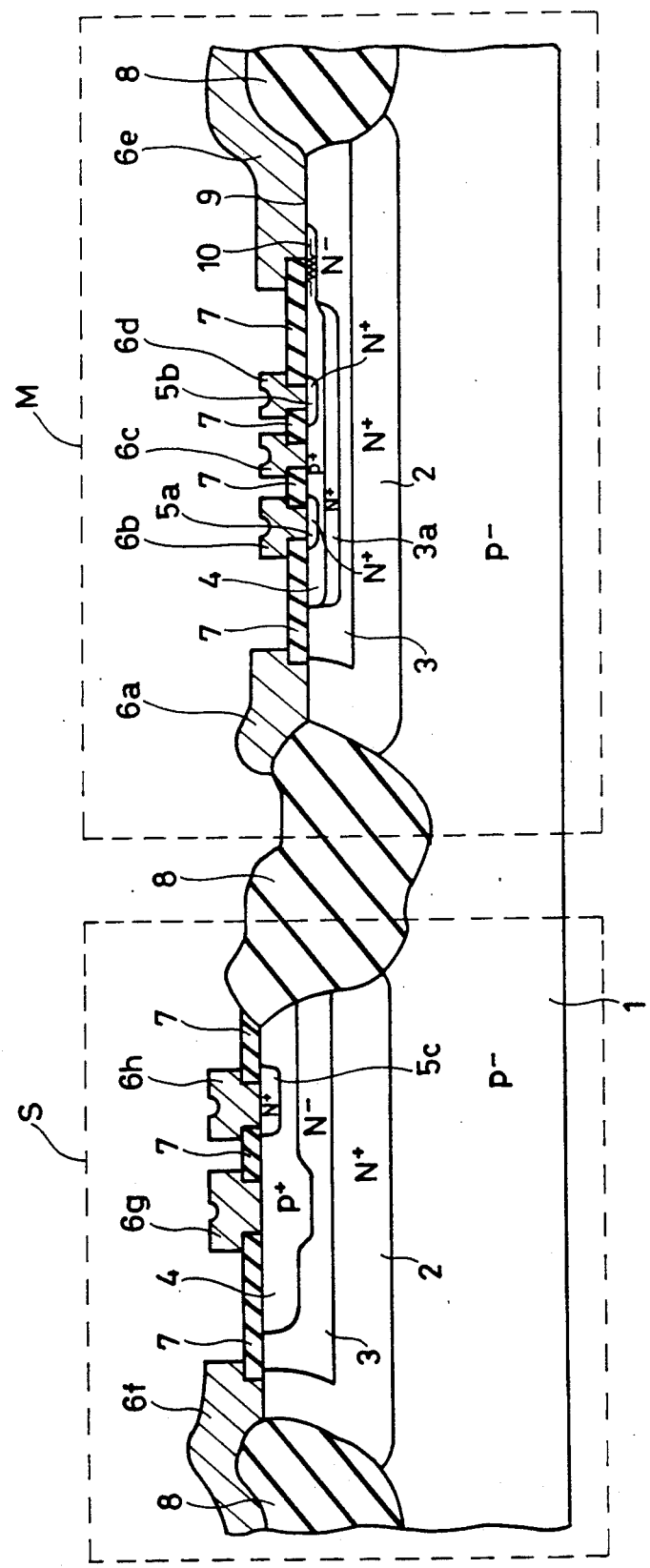

Referring to FIG. 5G, an oxide film 7 is formed on the memory cell portion M and the peripheral circuit portion S. A contact hole is formed on a prescribed region of the oxide film 7 to provide an electrical contact for the transistor. Aluminum is deposited on the surfaces of the memory cell portion M and the peripheral circuit portion S by sputtering, and then aluminum wires of prescribed patterns 6a, 6b, 6c, 6d, 6e, 6f and 6h are formed by photolithography and etching.

The aluminum wire 6a is connected to the collector of a transistor in the memory cell. The aluminum wires 6b and 6d connect the emitter regions 5a and 5b of the transistor in the memory cell to a bit line or to a hold line to draw a constant current. The aluminum wire 6e is connected to a word line. A resistance 10 (diffusion resistance) is formed between the p+ type base diffusion region 4 at the aluminum wire 6e while a Schottky barrier diode 9 is formed between the aluminum wire 6e and the n− type epitaxial layer 3.

Meanwhile, in the peripheral circuit portion S, the aluminum wire 6f is connected to the collector, the aluminum wire 6g is connected to the base diffusion layer 4 and the aluminum wire 6h is connected to the emitter diffusion layer 5c.

As shown in FIG. 5G, since the thickness of the n− type epitaxial layer 3 in the memory cell portion M is made thinner than that in the peripheral circuit portion S and the concentration of the n− type epitaxial layer 3 is made larger than that in the peripheral circuit portion S, and also by virtue of the floating of n− type impurities from the n+ type buried layer 2, the base-collector junction capacitance value $C_{TC}$ in the memory cell portion is increased, and consequently the device becomes stable against the inversion of information in the memory cell induced by α particles etc. and hence the device becomes highly reliable.

The speed of operation does not decrease since a speed up capacitor exists. In addition, the depth of the base junction eventually becomes shallower than that of the transistor in the peripheral circuit portion S so that the current amplification rate $h_{fe}$ of the transistors in the memory cell portion M can be increased. The current amplification rate $h_{fe}$ is defined by $I_C/I_B$ ($I_C$: collector current, $I_B$: base current) where the following conception can be taken out in the memory cell of a bipolar RAM. The collector potential $V_H$ of the transistors in the off state is given as follows, as described above:

$$V_H = V_W - R \cdot I_B$$

When the current gain $h_{fe}$ of the memory transistor is small, the base current $I_B$ cannot be neglected. Meanwhile, when the current gain $h_{fe}$ of the memory transistor is large, the base current can be mostly neglected and $V_H \approx V_W$. Now when the collector potential of the transistor in the on state is $V_L$, then:

when $h_{fe}$ is small;

$$V_H - V_L = (V_W - R I_B) - V_L$$

when $h_{fe}$ is large;

$$V_H - V_L \approx V_W - V_L$$

therefore, when the current amplification rate $h_{fe}$ is large, $V_H - V_L$ can be increased, so that the storing margin of the signal potential in the memory cell can be increased. In the bipolar RAM, the information potential $V_H$ and $V_L$ in the memory cell is compared with the reference potential $V_R$ and, the switching operation of the transistors in the memory cell is determined depending on the magnitude of the difference between the information potential and the reference potential. When the difference of $V_H - V_R$ or $V_R - V_L$ becomes larger, the switching operation of the transistor becomes faster. Therefore, by increasing the current amplification rate $h_{fe}$, in conjunction of the function of the speed up capacitor, the operation speed of the memory transistor can be increased.

Meanwhile, the base-collector junction capacitance of the capacitance value $C_{TC}$ in the peripheral circuit portion S should be preferably as small as possible since it works only as a parasitic capacitance. Referring to FIG. 5G, however, the n− type epitaxial layer 3 in the peripheral circuit portion S is thicker and of smaller concentration than that in the memory cell portion M, so that the base-collector junction capacitance value $C_{TC}$ is decreased, enabling a high speed operation.

Although one example of a manufacturing method of the device of the present invention is shown in FIGS. 5A through 5G, any other method can be applied that makes the n− type epitaxial layer in the memory cell portion M thicker than that in the peripheral circuit portion S and that makes the concentration of the n− type epitaxial layer in the memory cell portion M larger than that in the peripheral circuit portion S.

Figure 6:
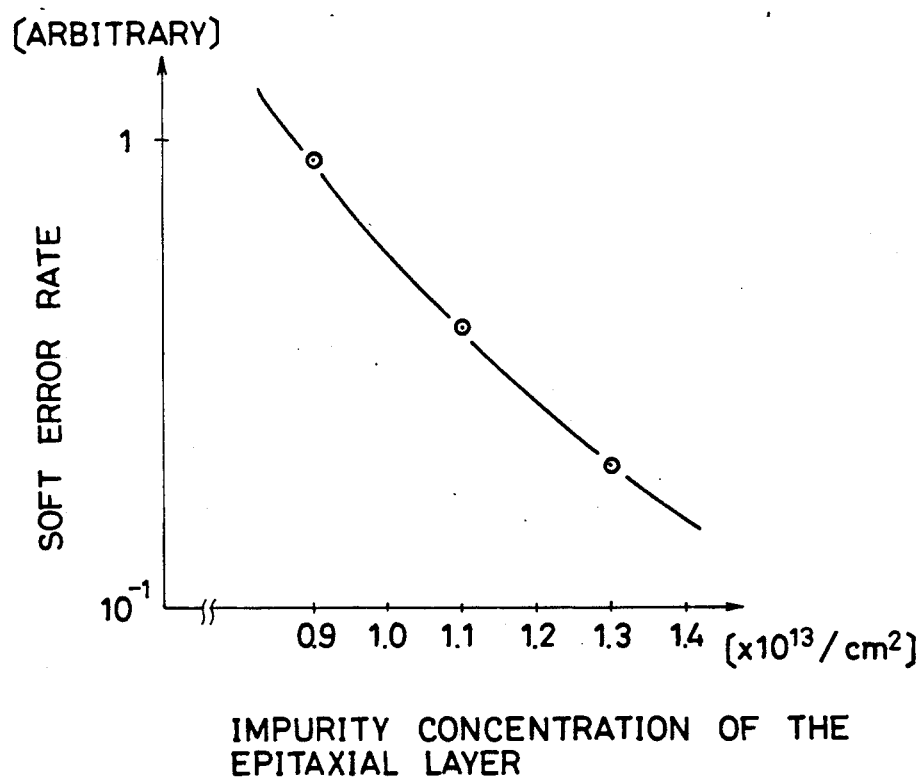
FIG. 6 shows the relation between the soft error rate and the impurity concentration of the epitaxial layer forming a collector of a transistor in the memory cell.

FIG. 6 shows the relation between the soft error rate and the impurity concentration of the epitaxial layer in the memory cell portion. In FIG. 6, the abscissa shows the impurity concentration of the epitaxial layer and the ordinate shows the soft error rate. As can be seen in FIG. 6, as the impurity concentration becomes higher, soft error rate decreases greatly. Therefore, by setting the impurity concentration of the epitaxial layer at more than $0.9 \times 10^{13}/cm^3$, the soft error rate can be depressed.

FIG. 7 shows the relation between the soft error rate and the thickness of the epitaxial layer in the memory cell portion. In FIG. 7, the abscissa shows the etching depth of the epitaxial layer in the memory cell portion and the ordinate shows the soft error rate. As can be seen from FIG. 7, when the epitaxial layer becomes thinner, the soft error rate decreases greatly. Therefore, by etching the epitaxial layer by more than 2500 Å in the memory cell portion to make it thinner error than the epitaxial layer in the peripheral circuit portion, a bipolar RAM having high immunity to soft errors can be implemented.

As described above, according to the present invention, the film thickness of the epitaxial layer only in the memory cell portion is made thin and the concentration of the epitaxial layer only in the memory cell portion is made large so as to increase the base-collector junction capacitance value in the memory cell portion, thereby providing a semiconductor memory device which is capable of a high speed operation and is highly reliable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor device of a flip-flop type comprising a memory cell portion and a peripheral bipolar circuit portion, said memory cell portion formed on cross-coupled bipolar transistors, wherein each said coupled bipolar transistor of said memory cell portion is a vertical integrated transistor structure comprising a substrate, an epitaxial layer of a first conductivity type formed on said substrate and forming a collector region, a first layer of a second, opposite conductivity type forming a base region on said epitaxial layer, and a second semiconductor layer of the first conductivity type forming an emitter region of said transistor in said first semiconductor layer, said memory cell portion establishing a first collector-base capacitance; and wherein each said bipolar transistor of said peripheral portion is a vertical integrated transistor structure comprising a substrate, an epitaxial layer of the first conductivity type formed on said substrate and forming a collector region, a first layer of the second conductivity type forming a base region on said epitaxial layer, and a second semiconductor layer of the first conductivity type forming an emitter region of said transistor in said second semiconductor layer, said peripheral portion establishing a second collector-base capacitance, the improvement wherein said epitaxial layer in the memory cell portion is thinner than said epitaxial layer in the peripheral circuit portion and the impurity density of said epitaxial layer in the memory cell portion is made larger than said epitaxial layer in said peripheral portion; and said first collector-base capacitance of a bipolar transistor in the memory cell portion is larger than said second collector-base capacitance of a bipolar transistor in the peripheral portion whereby soft error immunity of the memory cell portion is improved.

2. An improvement in accordance with claim 1, wherein said first conductivity type is n type and said second conductivity type is p type.

3. An improvement in accordance with claim 1, wherein said impurity density of said epitaxial layer in the memory cell portion is larger than $0.9 \times 10^{13}/cm^3$, and said epitaxial layer in the memory cell portion is thinner than said epitaxial layer in the peripheral circuit portion by more than 2500 Å.

4. An improvement in accordance with claim 1, wherein the bipolar transistor in said memory cell portion comprises a buried layer of the first conductivity type between said epitaxial layer and said substrate, for reducing the collector resistance of the transistor.

5. An improvement in accordance with claim 1, wherein the bipolar transistor in said memory cell portion comprises an impurity diffusion layer of the first conductivity type on the surface of said epitaxial layer below said first layer for increasing the impurity density of said epitaxial layer in said memory cell portion.

6. An improvement in accordance with claim 1, wherein each of said cross-coupled bipolar transistors is formed of a multiemitter bipolar transistor having a collector and a plurality of emitters, the collector being connected through a resistor and a Schottky barrier diode to a word line for selecting a memory cell, and one of the emitters being connected to a bit line for reading information from and writing information into the memory cell.

7. A Semiconductor memory device including a memory cell having at least one bipolar transistor and a peripheral circuit having at least one bipolar transistor, comprising:

a semiconductor body of a first conductivity type having a planar major surface;

a first bipolar transistor for said peripheral circuit having a collector region provided by a first epitaxial layer of a second conductivity type formed on a portion of said major surface of said semiconductor body, a base region provided by a first semiconductor region of the first conductivity type formed in said collector region and forming PN junction with said collector region, and an emitter region provided by a second semiconductor region of the second conductivity type formed in said base region and forming a PN junction with said base region; and a bipolar transistor for said memory cell having a memory cell collector region of the second conductivity type provided by a second epitaxial layer formed on a portion of said surface of said semiconductor body, a memory cell base region provided by a third semiconductor region of the first conductivity type formed in said second epitaxial layer and forming PN junction with the memory cell collector region, and a memory cell emitter region provided by a fourth semiconductor region of the second conductivity type formed in the memory cell base region and forming a PN junction therewith, the impurity concentration of the portion of the memory cell collector region contacted to the PN junction between the memory cell collector region and the memory cell base region being greater than the impurity concentration of the portion of said collector region contacted to PN junction between said collector region and said base region of said bipolar transistor for said peripheral circuit, and said second epitaxial layer being thinner than said first epitaxial layer.

8. A memory device according to claim 7, wherein said impurity concentration of said portion of the memory cell collector region contacted to the PN junction of the bipolar transistor for the memory cell is greater than $0.9 \times 10^{13}/cm^3$, and said second epitaxial layer is thinner than said first epitaxial layer by more than 2500 Å.

9. A memory device according to claim 7, wherein said memory cell includes a pair of bipolar transistors having their collectors and bases cross coupled and their emitters commonly connected.

10. A memory device according to claim 7, further comprising a buried layer of the second conductivity type disposed between said second epitaxial layer and said semiconductor body, for reducing the collector resistance of the bipolar transistor for the memory cell.

11. A memory device according to claim 7, further comprising an impurity diffusion layer of the second conductivity type disposed on a surface of said second epitaxial layer below said base region for increasing the impurity concentration of said second epitaxial layer.

12. A memory device according to claim 9, wherein each of said cross-coupled bipolar transistors is formed of a multi-emitter bipolar transistor having a collector and a plurality of emitters, the collector being connected through a resistor and a Schottky barrier diode to a word line for selecting a memory cell, and one of the emitters being connected to a bit line for reading information from and writing information into the memory cell.

* * * * *